(12) United States Patent
Denis et al.

(10) Patent No.: US 10,630,302 B2
(45) Date of Patent: Apr. 21, 2020

(54) OPTICALLY PUMPED ATOMIC CLOCK AND ASSOCIATED MANUFACTURING PROCESS

(71) Applicant: THALES, Courbevoie (FR)

(72) Inventors: Philippe Denis, Velizy-Villacoublay (FR); Philippe Favard, Velizy-Villacoublay (FR); Michel Baldy, Velizy-Villacoublay (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/165,945

(22) Filed: Oct. 19, 2018

(65) Prior Publication Data

US 2019/0123750 A1   Apr. 25, 2019

(30) Foreign Application Priority Data

Oct. 23, 2017   (FR) .................................... 17 01098

(51) Int. Cl.
  *H01S 1/06*   (2006.01)
  *H03B 17/00*   (2006.01)
  *H03L 7/26*   (2006.01)
  *G04F 5/14*   (2006.01)

(52) U.S. Cl.
  CPC . *H03L 7/26* (2013.01); *G04F 5/14* (2013.01)

(58) Field of Classification Search
  CPC .................................... H03L 7/26; G04F 5/14
  USPC ......................................................... 331/94.1
  See application file for complete search history.

(56) References Cited

U.S. PATENT DOCUMENTS

| 4,323,860 | A  | 4/1982  | Leiby et al. |
| 5,146,185 | A  | 9/1992  | Lewis |
| 6,172,570 | B1 | 1/2001  | Deng |
| 6,303,928 | B1 | 10/2001 | Buell et al. |

FOREIGN PATENT DOCUMENTS

| EP | 1 691 242 A1 | 8/2006 |
| EP | 2 131 500 A2 | 12/2009 |
| EP | 2 154 585 A2 | 2/2010 |
| EP | 2 829 925 A2 | 1/2015 |
| WO | 03/078977 A1 | 9/2003 |

*Primary Examiner* — Richard Tan
(74) *Attorney, Agent, or Firm* — Baker & Hostetler LLP

(57) ABSTRACT

An optically pumped atomic clock includes an optically pumped atomic resonator provided with a vacuum-tight envelope equipped with optical interfaces and comprising, inside the vacuum-tight envelope a resonant cavity, optical mirrors, and caesium traps made of graphite, and outside the vacuum-tight envelope a vacuum pump, a magnetic shield, a magnetic field coil, an RF cable, a caesium oven, and an interface for connection with the caesium oven.

12 Claims, 3 Drawing Sheets

OPTICALLY PUMPED ATOMIC CLOCK AND ASSOCIATED MANUFACTURING PROCESS

CROSS-REFERENCE TO RELATED APPLICATIONS

This application claims priority to foreign French patent application No. FR 1701098, filed on Oct. 23, 2017, the disclosure of which is incorporated by reference in its entirety.

FIELD OF THE INVENTION

The present invention relates to an optically pumped atomic clock and to an associated manufacturing process.

The field of the invention is that of optically pumped atomic clocks.

BACKGROUND

The basic principle of an atomic clock is to use as a frequency reference a transition of an atom, ion or molecule that naturally has metrological qualities and that is accessible. To do this it is necessary to use a rigorously fixed frequency possessing a character that is absolute both in time and space.

Atomic transitions are considered to have this absolute character of invariance in time and in space. This postulate has not been invalidated up to now. Caesium has been chosen to define the second.

Optically pumped caesium-beam atomic clocks are well known and have demonstrated their reliability.

Optically pumped atomic clocks generally comprise optically pumped caesium tubes, or, in other words, optically pumped atomic resonators using caesium, that comprise many elements inside a vacuum-tight envelope.

FIG. 1 schematically shows an atomic resonator 1 of the prior art, and more particularly its vacuum-tight enveloped portion 2, which is equipped with optical interfaces 3 and comprises a caesium oven 11 and a magnetic shield 8 that is passed through by a caesium beam. The magnetic shield 8 surrounds a resonant cavity 4, caesium traps 6 made of graphite, a magnetic field coil 9, and an RF cable 10.

The caesium oven 11 of the vacuum-tight envelope 2 is placed outside the magnetic shield 8, as is the interface 11a for connection with the caesium oven 11. A vacuum pump 7 is placed partially outside the vacuum-tight envelope 2 and partially inside, as an optical unit comprising a laser source 5a and optical mirrors 5b.

Such resonators comprise about 250 elements, which, for reasons of assembly and performance constraints, are integrated into the interior of the vacuum chamber or envelope. Many of these elements have a function that does not require operation under vacuum, but they are placed under vacuum for reasons of manufacturing constraints; these elements represent a mass of more than 5 kg.

SUMMARY OF THE INVENTION

One aim of the invention is to decrease the mass of the vacuum-tight envelope by minimizing its volume.

Another aim of the invention is to remove from the vacuum-tight envelope materials that are sensitive to vacuum and to temperature in order to avoid degassing problems and allow baking to be carried out at higher temperature.

Another aim of the invention is to drastically decrease manufacturing cost by decreasing the number of parts and the number of manufacturing steps.

The invention aims to partially solve the aforementioned problems.

Thus, there is provided, according to one aspect of the invention, an optically pumped atomic clock comprising:
  an optically pumped atomic resonator provided with a vacuum-tight envelope equipped with optical interfaces and comprising, inside the vacuum-tight envelope:
    a resonant cavity,
    optical mirrors, and
    caesium traps made out of graphite, and
  outside the vacuum-tight envelope:
    a vacuum pump,
    a magnetic shield,
    a magnetic field coil,
    an RF cable,
    a caesium oven, and
    an interface for connection with the caesium oven.

Thus, elements conventionally present in the vacuum-tight envelope are relocated to outside the vacuum-tight envelope, this allowing its volume and its mass to be substantially decreased.

Furthermore, materials that are sensitive to vacuum and to temperature are removed from the vacuum-tight envelope, thereby avoiding degassing problems and allowing baking to be carried out at higher temperature.

According to one embodiment, the vacuum-tight envelope is made of titanium.

Using a vacuum-tight envelope made of titanium allows its mechanical properties to be capitalized upon and allows the getter effect of this type of material to be employed and therefore allows the pumping of the vacuum chamber to be improved.

In one embodiment, the vacuum-tight envelope comprises two portions and a brazing alloy joining the two portions of the vacuum-tight envelope.

Thus, all the internal portions under vacuum are produced in the same part, making alignment operations redundant.

For example, the brazing alloy may comprise titanium.

Using a brazing alloy comprising titanium makes it possible to guarantee an optimal mechanical strength.

As a variant, the brazing alloy may comprise gold.

Using a brazing alloy comprising gold makes it possible to guarantee a small amount of degassing.

As a variant, the brazing alloy may comprise copper.

Using a brazing alloy comprising copper makes it possible to guarantee a small amount of degassing while decreasing production cost.

According to one embodiment, said resonant cavity and said optical components comprise a copper coating.

Thus, it is easy to carry out mechanical rework to ensure precise dimensions are achieved, for the resonant cavity for example, and to improve the surface finish of optical components to a mirror finish.

According to another aspect of the invention, a process for manufacturing an optically pumped atomic clock such as described above is also provided, this process comprising a step of manufacturing an optically pumped atomic resonator provided with a vacuum-tight envelope comprising substeps consisting in:
  producing two portions of the vacuum-tight envelope by 3-D printing; and
  brazing alloying the two portions of the vacuum-tight envelope.

Such a process allows the number of parts to be assembled and the number of manufacturing steps to be carried out to be decreased, this allowing manufacturing cost to be limited.

In one implementation, the process comprises a sub-step consisting in covering the resonant cavity and the optical components inside the vacuum-tight envelope with copper.

According to one implementation, the vacuum-tight envelope is made of titanium and the brazing alloy between the two portions of the vacuum-tight envelope is a direct brazing alloy.

As a variant, the vacuum-tight envelope is made of titanium and the brazing alloy between the two portions of the vacuum-tight envelope comprises gold.

As a variant, the vacuum-tight envelope is made of titanium and the brazing alloy between the two portions of the vacuum-tight envelope comprises copper.

BRIEF DESCRIPTION OF THE DRAWINGS

The invention will be better understood on studying a few embodiments that are described by way of completely nonlimiting example and illustrated by the appended drawings in which.

In all the figures, elements referenced with identical references are similar.

DETAILED DESCRIPTION

In the present description, the described embodiments are completely nonlimiting, and features and functions well known to those skilled in the art are not described in detail.

Figure 1:
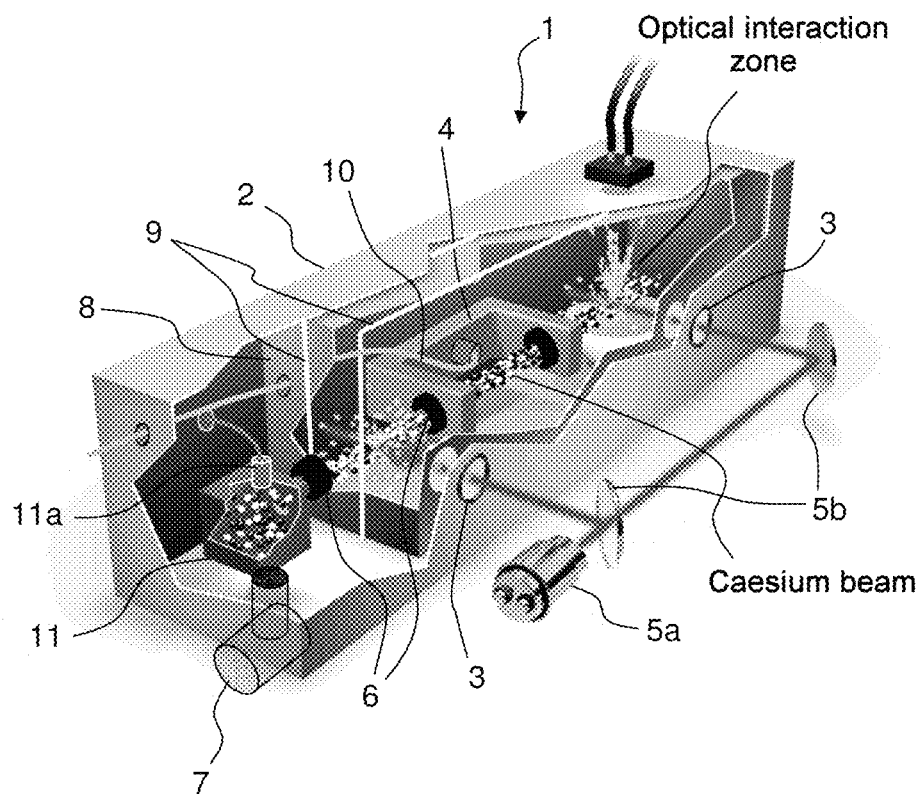
FIG. 1 schematically illustrates an atomic-resonator vacuum-tight envelope of an optically pumped atomic clock according to the prior art.
Figure 2:
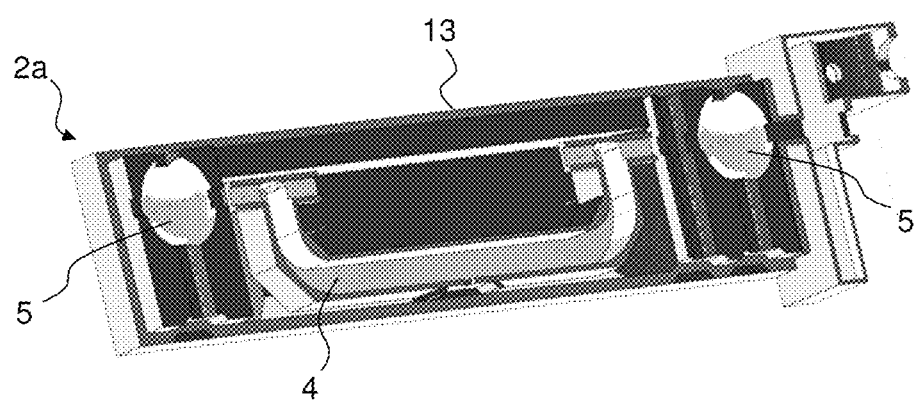
FIGS. 2 and 3 schematically illustrate two portions of a vacuum-tight envelope, according to one aspect of the invention.
Figure 3:
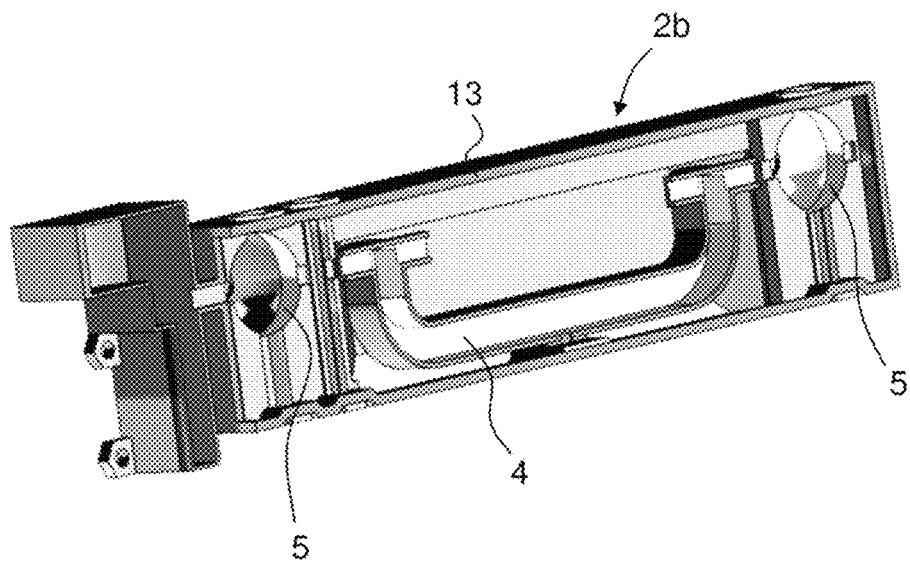

FIGS. 2 and 3 show two portions 2a and 2b of the vacuum-tight envelope or chamber 2, or two vacuum half-jackets 2a and 2b, that are manufactured by additive manufacturing, also called 3-D printing. A metal layer, for example of copper, is deposited on internal elements, such as the optical mirrors 5 and the resonant cavity 4, in order to ensure that the various functions of the atomic resonator 1 are performed.

These two portions 2a, 2b of the vacuum-tight envelope 2 are then assembled by brazing alloying. The brazing alloy 13 may be a direct brazing alloy, i.e. one comprising titanium, or may be a brazing alloy containing gold or copper.

These two half-jackets 2a, 2b integrate before assembly, in addition to the vacuum function, the resonant cavity 4 (Ramsey cavity), and the optical zones or optical mirrors 5.

A metal layer, for example of copper, is then deposited on the internal portions of these two portions 2a, 2b. The internal faces of the resonant cavity 4, of the optical mirrors 5 and of the assembly interfaces are then reworked by machining in order to ensure that the RF function, the optical function and the function of the vacuum-tight joint are performed. In this example, the optical interfaces 3 of the vacuum-tight envelope 2 are shown in FIGS. 4, 5 and 6.

After integration of additional parts, such as caesium traps (6) made of graphite, into the interior of the atomic resonator, the two half-jackets 2a, 2b are assembled by vacuum brazing alloying in order to obtain a cavity that is seal-tight to ultra-high vacuum. The expression "ultra-high vacuum" is understood to mean a vacuum characterized by pressures lower than $1 \times 10^{-7}$ mbar.

Figure 4:
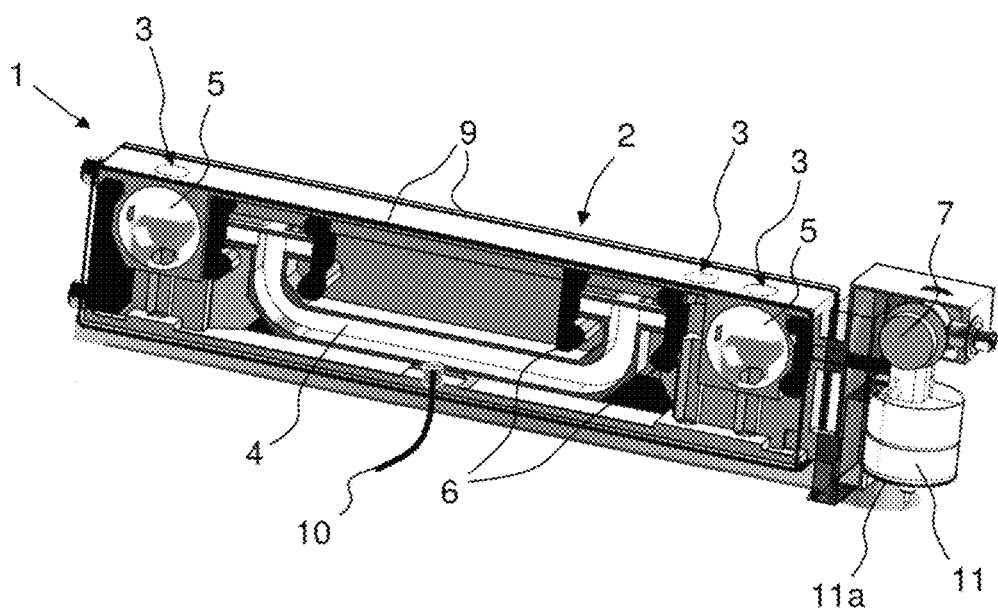
FIG. 4 schematically illustrates a cross-sectional view of an atomic resonator of an optically pumped atomic clock, according to one aspect of the invention.

FIG. 4 shows a cross-sectional view of an optically pumped atomic resonator 1 according to one aspect of the invention. The optically pumped atomic resonator 1 is provided with a vacuum-tight envelope 2 equipped with optical interfaces 3 and comprises, inside the vacuum-tight envelope 2, a resonant cavity 4, optical mirrors 5, and caesium traps 6 made of graphite. In contrast, a vacuum pump 7, a magnetic shield 8 (not shown in this figure), a magnetic field coil 9, an RF cable 10, a caesium oven 11, and an interface 11a for connection with the caesium oven 11 are placed outside the vacuum-tight envelope 2.

Figure 5:
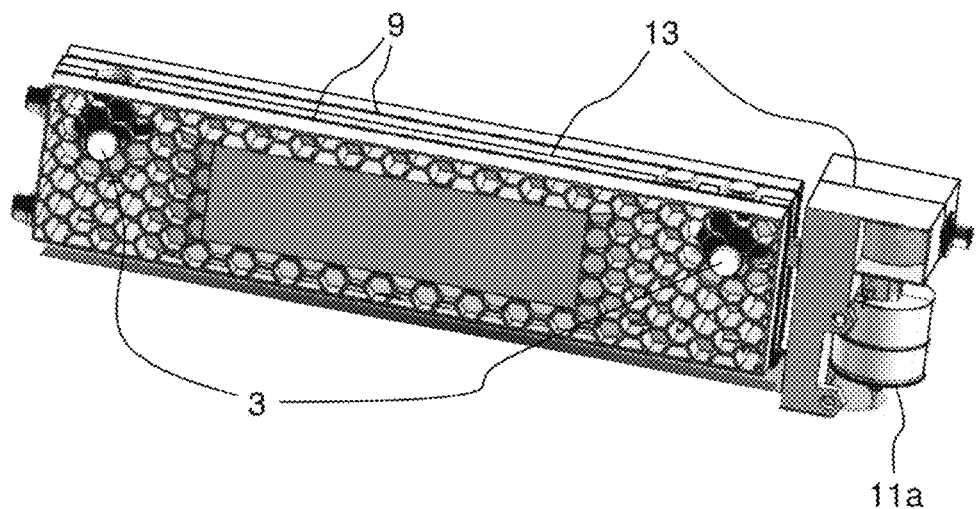
FIG. 5 schematically illustrates an overview of an atomic resonator of an optically pumped atomic clock, without its magnetic shield, according to one aspect of the invention.
Figure 6:
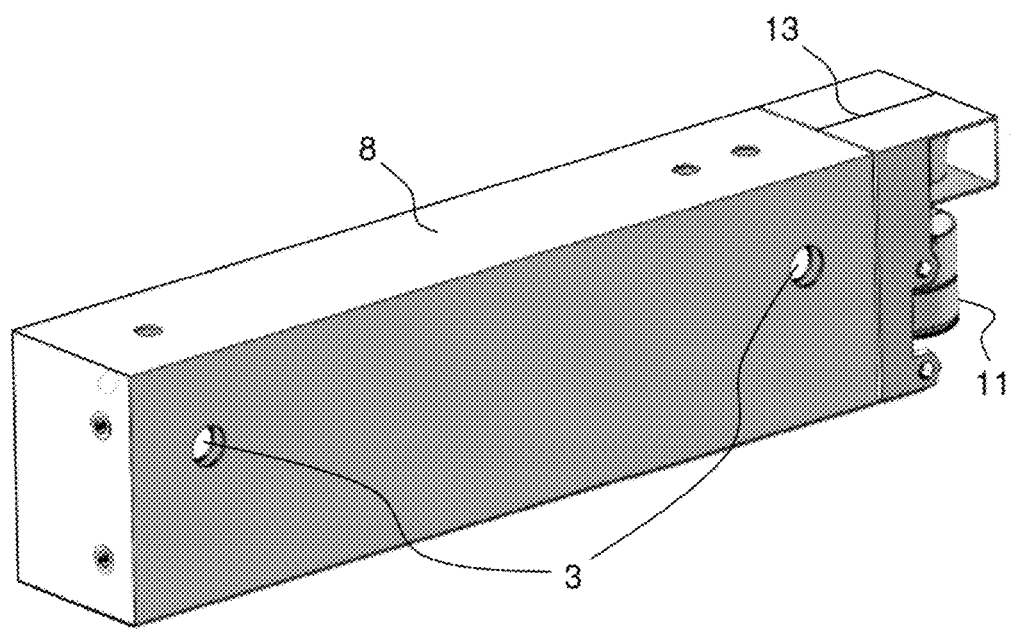
FIG. 6 schematically illustrates an overview of an atomic resonator of an optically pumped atomic clock, with its magnetic shield, according to one aspect of the invention.

FIG. 5 shows an overview of an atomic resonator 1 of an optically pumped atomic clock, without its magnetic shield 8, and FIG. 6 shows an overview of the atomic resonator 1 of FIG. 5, with its magnetic shield 8 outside the vacuum-tight envelope 2.

Thus, parts which do not need to be under vacuum to operate or that are sensitive to vacuum, in particular the magnets of the vacuum pump 7, the magnetic shield 8, the magnetic field coil 9, the RF cable 10, the caesium oven 11 and its connection interface 11a, may be placed outside the vacuum-tight envelope 2.

The present invention allows two titanium half-jackets 2a, 2b of the vacuum-tight envelope 2 to be manufactured by additive manufacturing, commonly called 3-D printing. In this embodiment, a metal layer, for example of copper, is deposited on those portions that require either mechanical rework to ensure precise dimensions are achieved or a particular surface finish—the mirrors or brazing alloying interfaces for example.

Depending on the complexity of the parts to be assembled, the various component elements of the caesium atomic resonator 1 are assembled by brazing alloying in one or more steps. The assembly thus formed is devoid of any component or material unsuitable for use under ultra-high vacuum, such as electrical cables and electronic components and materials of low vapourization point such as Kapton. Furthermore, the present invention allows the complete resonator to be assembled almost in a single step, without mechanical mounting and without constraints related to adjustment of the alignments of the various elements that are produced directly in the machined part and that are the components thereof, such as the resonant cavity 4 (or Ramsey cavity), the laser-interaction mirrors 5 and the passage for the caesium beam.

Lastly, this allows portions required for the resonator 1 to operate, in particular the RF cable 10 and the magnetic shield 8, to be mounted more easily, by direct access unconstrained by vacuum, and therefore easily demounted in case of malfunction.

The invention claimed is:
1. An optically pumped atomic clock comprising:
  an optically pumped atomic resonator provided with a vacuum-tight envelope equipped with optical interfaces and comprising, inside the vacuum-tight envelope:
    a resonant cavity, optical mirrors, and caesium traps made of graphite; and further comprising, outside the vacuum-tight envelope:

a vacuum pump, a magnetic shield, a magnetic field coil, an RF cable, a caesium oven, and an interface for connection with the caesium oven.

2. The optically pumped atomic clock according to claim 1, wherein the vacuum-tight envelope is made of titanium.

3. The optically pumped atomic clock according to claim 1, wherein the vacuum-tight envelope comprises two portions and a brazing alloy joining the two portions of the vacuum-tight envelope.

4. The optically pumped atomic clock according to claim 3, wherein the brazing alloy comprises titanium.

5. The optically pumped atomic clock according to claim 3, wherein the brazing alloy comprises gold.

6. The optically pumped atomic clock according to claim 3, wherein the brazing alloy comprises copper.

7. The optically pumped atomic clock according to claim 1, wherein said resonant cavity and said optical mirrors and said optical interfaces comprise a copper coating.

8. A process for manufacturing the optically pumped atomic clock according to claim 3, comprising a step of manufacturing the optically pumped atomic resonator provided with the vacuum-tight envelope, and comprising:

producing two portions of the vacuum-tight envelope by 3-D printing; and brazing alloy between the two portions of the vacuum-tight envelope.

9. The process according to claim 8, further comprising covering the resonant cavity and the optical mirrors and the optical interfaces inside the vacuum-tight envelope with copper.

10. The process according to claim 8, wherein the vacuum-tight envelope is made of titanium and the brazing alloy between the two portions of the vacuum-tight envelope is a direct brazing alloy.

11. The process according to claim 8, wherein the vacuum-tight envelope is made of titanium and the brazing alloy between the two portions of the vacuum-tight envelope comprises gold.

12. The process according to claim 8, wherein the vacuum-tight envelope is made of titanium and the brazing alloy between the two portions of the vacuum-tight envelope comprises copper.

* * * * *